United States Patent [19]

Komuro

[11] Patent Number: 5,451,897
[45] Date of Patent: Sep. 19, 1995

[54] BUILT-IN SUPPLY VOLTAGE DROPPING CIRCUIT

[75] Inventor: Toshio Komuro, Tokyo, Japan

[73] Assignee: NEC Corporation, Tokyo, Japan

[21] Appl. No.: 936,653

[22] Filed: Aug. 28, 1992

[30] Foreign Application Priority Data

Aug. 30, 1991 [JP] Japan .................. 3-244853

[51] Int. Cl.6 .................. H03F 3/45; G05F 3/02
[52] U.S. Cl. .................. 327/544; 330/253
[58] Field of Search ........... 307/296.1, 296.3, 296.4, 307/571, 596; 330/253, 258, 277, 288; 327/530, 544

[56] References Cited

U.S. PATENT DOCUMENTS

| | | | |
|---|---|---|---|
| 4,893,092 | 1/1990 | Okamoto | 330/253 |
| 4,935,702 | 6/1990 | Mead et al. | 330/253 X |
| 4,990,862 | 2/1991 | Narabu et al. | 330/253 |
| 4,999,519 | 3/1991 | Kitsukawa et al. | 307/296.3 |
| 5,300,823 | 4/1994 | Ihara | 307/296.3 |
| 5,329,169 | 7/1994 | Ihara | 307/296.3 |

Primary Examiner—Willis R. Wolfe
Attorney, Agent, or Firm—Sughrue, Mion, Zinn, Macpeak & Seas

[57] ABSTRACT

A built-in supply voltage dropping circuit according to the present invention includes a current mirror amplifier, a drive transistor with a gate connected to an output of the current mirror amplifier and a drain connected to the output terminal, and a current limiting device connected in series to the current mirror amplifier and adapted for controlling the current flow through the current mirror amplifier by control signals. This construction enables reduction of current consumption without lowering response speed.

4 Claims, 3 Drawing Sheets

BUILT-IN SUPPLY VOLTAGE DROPPING CIRCUIT

BACKGROUND OF THE INVENTION

1. Field of the Invention

This invention relates to a built-in supply voltage dropping circuit, and more particularly the same permitting reduced consumption current.

2. Description of the Prior Art

In recent years, for the purpose of curtailing consumption power, a power supply, which supplies voltages which are dropped by a built-in supply voltage dropping circuit, has been used for semiconductor devices. A semiconductor memory device is provided, for example, with a built-in supply voltage dropping circuit for dropping the supply voltage to the sense amplifier drive circuit.

This built-in supply voltage dropping circuit operates under the control of several activating signals. In detail, these activating signals control turn-on and -off of transistors constituting current-limiting means. Turn ON the current limiter transistors, and the built-in supply voltage dropping circuit is activated to generate a dropped voltage.

A built-in supply voltage dropping circuits in a prior art are required to be designed for good response characteristics to set the current flows through the current limiter transistors to large values. In other words, for rapid generation of a desired voltage from the built-in supply voltage dropping circuit, it is necessary to increase drive current flow in the built-in supply voltage dropping circuit by causing a large current to flow through the current limiter transistors, with the resulting higher speed operation of the circuit.

The built-in supply voltage dropping circuit as described above, however has problem, i.e., large power consumption of the whole device due to a large current always flowing through the current limiter transistors.

BRIEF SUMMARY OF THE INVENTION

1. Object of the Invention

It therefore is an object of the present invention to provide a built-in supply voltage dropping circuit permitting to reduced current consumption current without lowering circuit response speed.

2. Summary of the Invention

A built-in supply voltage dropping circuit according to the present invention includes a current mirror amplifier, a drive transistor with a gate connected to the output of the current mirror amplifier and a drain connected to the output terminal, and a current limiting device connected in series to the current mirror amplifier acting as means and adapted for controlling the current flow through the current mirror amplifier by responsive to at least one control signal.

A preferred built-in supply voltage dropping circuit comprises: a current mirror circuit; a plurality of current limiter transistors connected in parallel, each of at least two different activating signals being fed to the gates of the current limiter transistors, respectively, thereby controlling the current flow through the current mirror circuit; first and second transistors provided between the current mirror circuit and the plurality of current limiter transistors and constituting a differential pair; and a drive transistor provided between a power supply and an output terminal and having a gate connected to the output of the current mirror circuit; wherein; output terminal is connected to the gate of the first transistor, and wherein a reference voltage is supplied to the gate of the second transistor.

BRIEF DESCRIPTION OF THE INVENTION

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
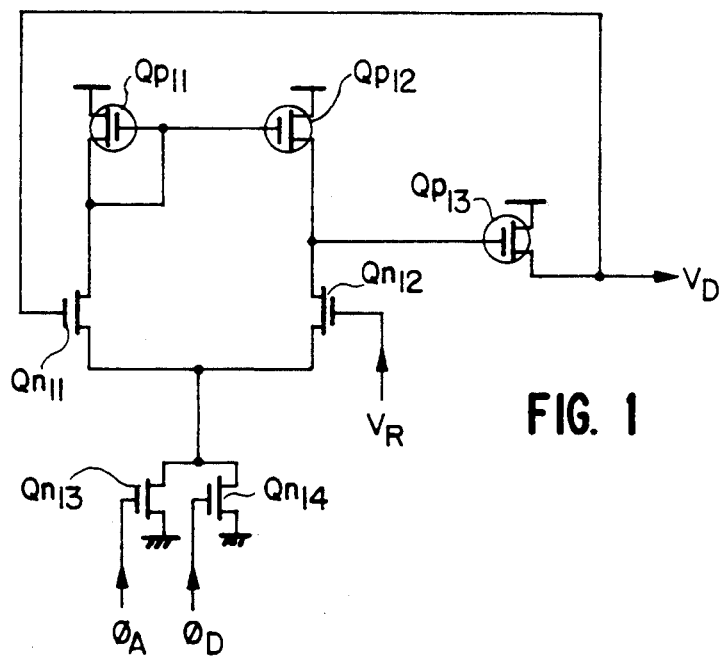
FIG. 1 is a circuit diagram of a built-in supply voltage dropping circuit as an illustrative embodiment of the present invention.

Referring to FIG. 1, a first embodiment of the present invention will be described hereinafter. A built-in supply voltage dropping circuit of the present invention includes p-type MOS transistors $Qp_{11}$, $Qp_{12}$ constituting a current mirror circuit; two n-type MOS transistors $Qn_{13}$, $Qn_{14}$ serving as current limiter transistors for controlling the current flow in the mirror circuit, the gates of transistors $Qn_{13}$ and $Qn_{14}$ being supplied with the first and second activating signals $\phi_A$ and $\phi_D$, respectively; n-type MOS transistors $Qn_{11}$, $Qn_{12}$ constituting a differential pair between the current mirror circuit and the current limiter transistors; and another p-type MOS transistor $Qp_{13}$ connected between a power supply and the output terminal, the gate of transistor $Qp_{13}$ connected to the output of the current mirror circuit. The output terminal is connected to the gate of n-type transistor $Qn_{11}$, while a reference voltage $V_R$ is supplied to the gate of n-type transistor $Qn_{12}$.

Figure 2:
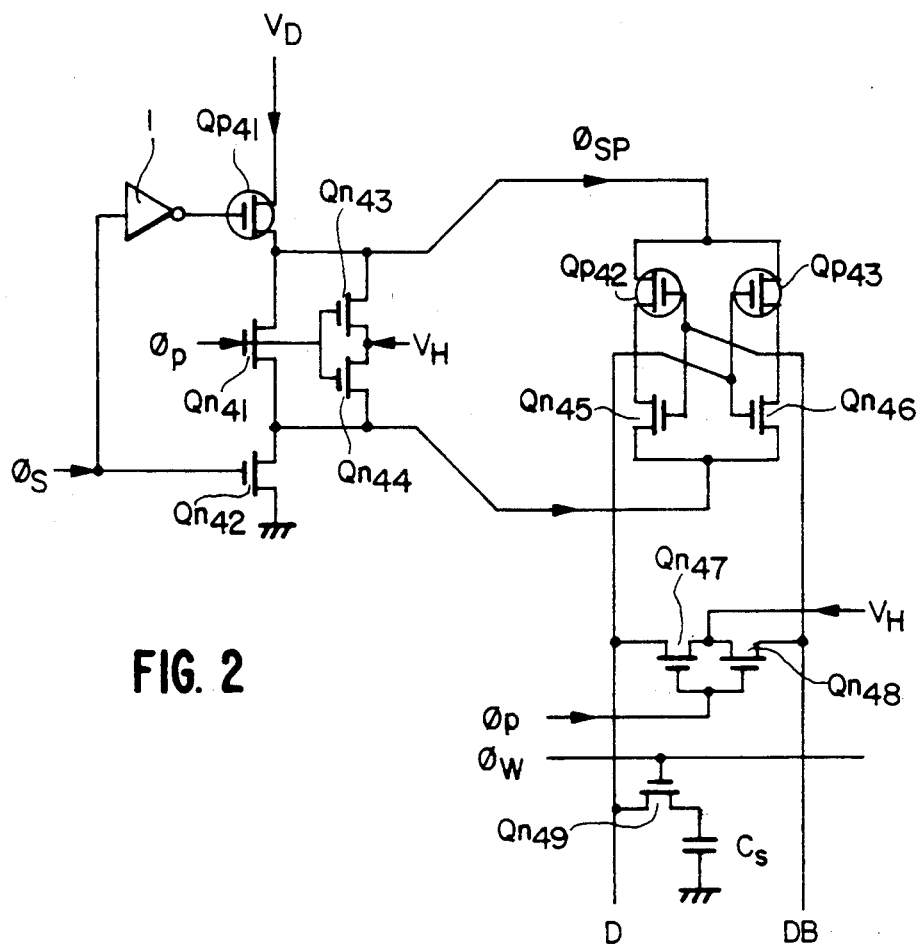
FIG. 2 is a circuit diagram for illustrating a semiconductor memory device connected to the built-in supply voltage dropping circuit of FIG. 1.

In this embodiment, the operation of the above described circuit will now be described using a semiconductor memory device. As an exemplary case, the sense amplifier drive circuit is fed, as a voltage supply, with the output $V_D$ of the built-in supply voltage dropping circuit shown in FIG. 1. FIG. 2 illustrates a part of the semiconductor memory device. The sense amplifier drive circuit is constructed of transistors $Qp_{41}$, $Qn_{41}$, $Qn_{42}$, $Qn_{43}$, $Qn_{44}$, and an inverter I, and generates supply voltages $\phi_{SP}$ and $\phi_{SN}$. The sense amplifier to which $\phi_{SP}$ and $\phi_{SN}$ are fed is constructed of transistors $Qp_{42}$, $Qp_{43}$, $Qn_{45}$, and $Qn_{46}$, and amplifies the potential difference between bit lines D and DB.

Figure 3:
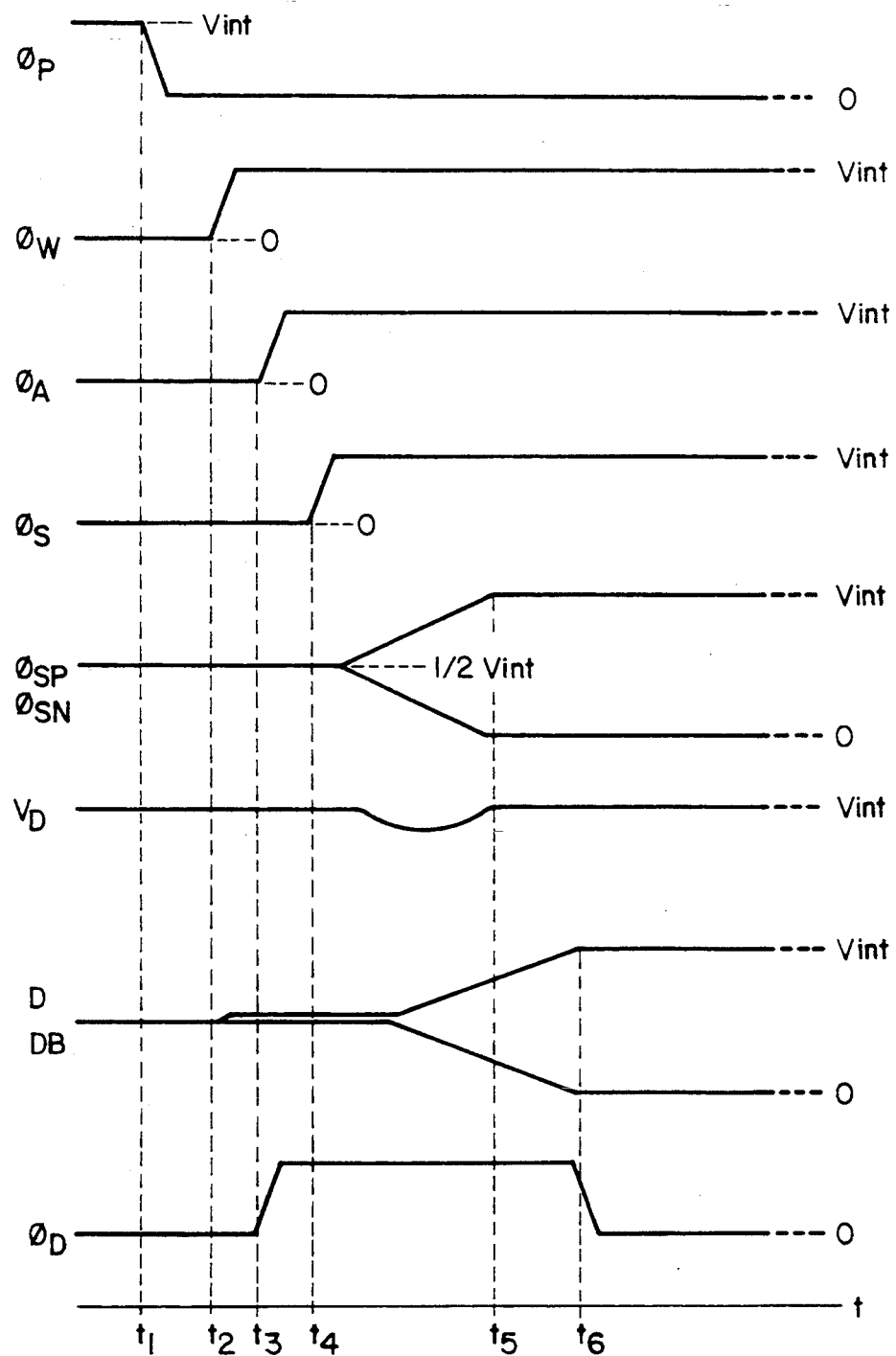
FIG. 3 is a set of waveforms for illustrating the operations of the circuits of FIGS. 1 and 2.

Referring to FIG. 3 in addition to FIGS. 1 and 2, the operation of the semiconductor memory device will be described below. Before time $t_1$, a precharge signal $\phi_P$ is at HIGH level, allowing the semiconductor memory device shown FIG. 2 to become precharged. Consequently, $\phi_{SP}$, $\phi_{SN}$ and bit lines D, BD achieve precharge potential $V_H$.

Further at this time, the first and second activating signals $\phi_A$ and $\phi_D$ are both at LOW level, consequently, with both current limiter transistors $Qn_{13}$ and $Qn_{14}$ turned off, the built-in supply voltage dropping circuit is inactivate, i.e., driver transistor $Qp_{13}$ is turned off.

At time $t_1$, precharge signal $\phi_P$ goes to 0 V, which causes transistors Qn41, Qn43, Qn44, Qn47, and Qn48 to turn off.

At time $t_2$, word line selective signal $\phi_W$ goes HIGH, which causes a transistor Qn49, constituting a memory cell, to turn ON, resulting in connection between a capacitor CS and bit line D and, in turn, the corresponding difference in potential between bit lines D and DB to a stored charge on capacitor $C_S$. FIG. 3 shows an example of storing a '1' (HIGH level) as data in the memory cell.

At time $t_3$, both the first and second activating signals $\phi_A$ and $\phi_D$ go HIGH, which simultaneously turns ON current limit transistors Qn13, Qn14, resulting in allowing a large current to flow through the current mirror circuit of the built-in supply voltage dropping circuit, thus rapidly becoming ready for controlling the voltage supply to the sense amplifier drive circuit.

At time $t_4$, the sense amplifier activating signal $\phi_S$ goes HIGH, which turns Qn41 and Qn42 ON, and consequently $\phi_{SP}$ goes to potential $V_D$ and $\phi_{SN}$ to ground potential (0 V). Thus the sense amplifier begins amplification of the potential difference between bit lines D and DB. With the lapse of time, supply potential $V_D$ falls initially due to the supply of power, and thereby the gate potential of $Qn_{11}$ in the built-in supply voltage dropping circuit is brought to be lower than reference voltage $V_R$ supplied to the gate of $Qn_{12}$, leading to the fall of the gate potential of $QP_{13}$ and, in turn, to increase of the capability of current supply. Thus, potential $V_D$ reaches a trough, followed by a rise, and consequently drive signal $\phi_{SP}$ and the potential of bit line D begins to rise.

If potential $V_D$ rises beyond reference potential $V_R$, the gate potential of $Qn_{11}$ becomes higher than the gate potential ($V_R$) of $Qn_{12}$, which causes the gate potential of $Qp_{13}$ to rise, thereby allowing the latter to be turned off, with the result of making potential $V_D$ equal to $V_R$ ($=V_{int}$) at time $t_5$.

At time $t_6$, when amplification of the sense amplifier has been completed, the second activating signal $\phi_D$ goes LOW, and only $Qn_{14}$ of the current limiter transistors is turned off, thereby current flow through the current mirror circuit of the built-in supply voltage dropping circuit is reduced. Thus, after time $t_6$, the overall current consumption of the device remains lowered.

As described above, in initial operation stage of this embodiment, up to time $t_6$ where the sense amplifier is activated, current limiter transistors $Qn_{13}$, $Qn_{14}$ are both in the 'on' state for controlling rise and fall of the supply voltage $V_D$, which enables rapid restoration of this voltage. On the other hand, when the built-in supply voltage dropping circuit is unneeded for operation at high speed, e.g., after amplification of the sense amplifier has been completed, it is possible to keep consumption current low by placing only $Qn_{14}$ of the current limiter transistors in the 'off' state. The embodiment described above comprises two current limiter transistors. This should not be considered as limiting, and instead three or more transistors of similar type may used as needed for control of current flow, thereby permitting finer control of consumption current to be achieved.

Figure 4:
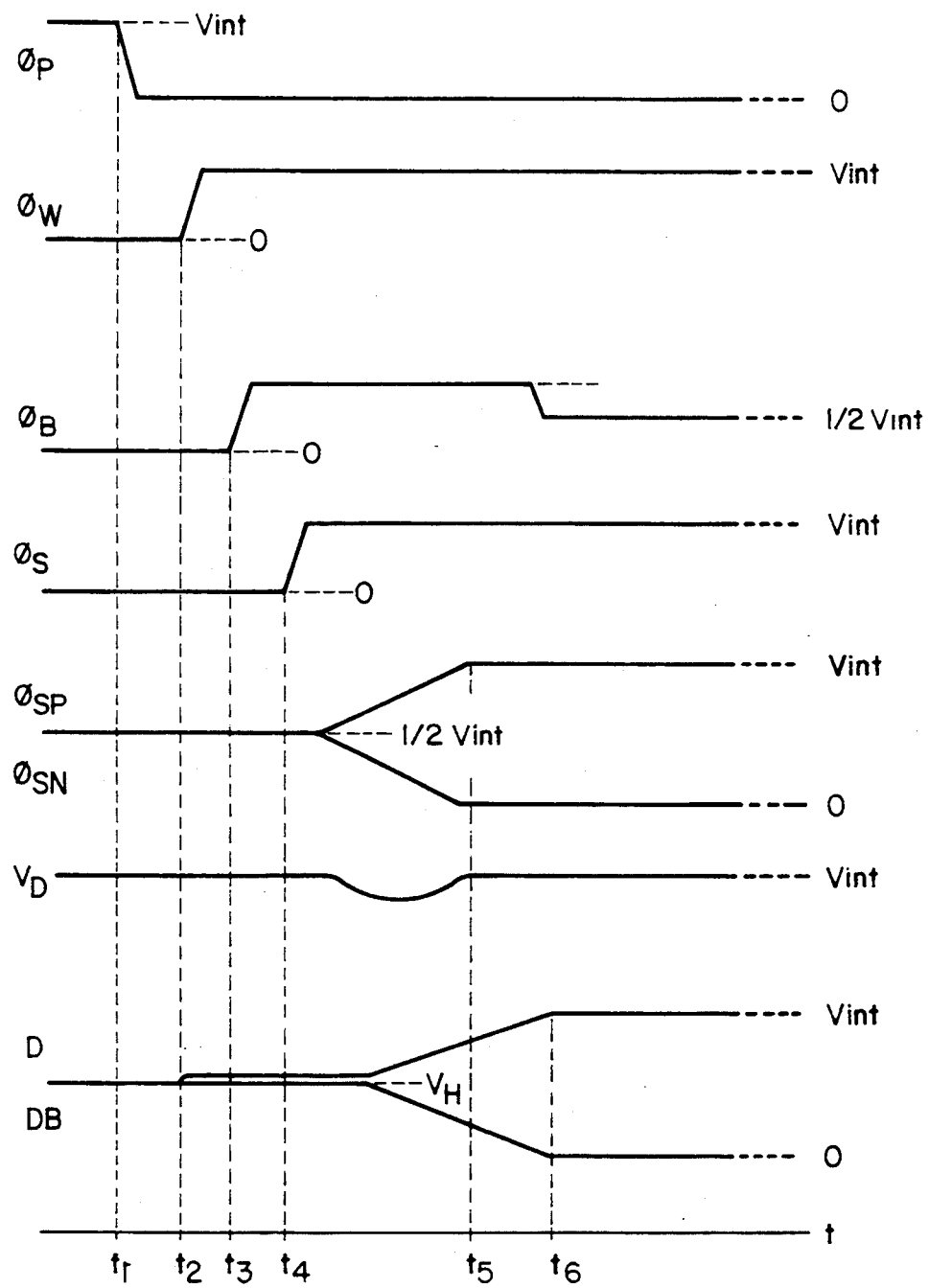
FIG. 4 is a set of waveforms for illustrating the operation of the second embodiment of the present invention.

The second embodiment of the present invention will be described with reference to FIG. 4 below. This embodiment is different from the first embodiment in that the built-in supply voltage dropping circuit comprises one current limiter transistor of which the activating signal $\phi_B$ has three levels, i.e., HIGH, MIDDLE, and LOW.

At time $t_3$, activating signal $\phi_B$ goes HIGH, which turns ON the current limiter transistor. In this situation, the current supply capability through the current limiter transistor is the same as that through both $Qn_{13}$ and $Qn_{14}$ when these transistors were turned ON in the first embodiment. Large current therefore flows in the current mirror circuit of the built-in supply voltage dropping circuit.

At time $t_6$, control signal $\phi_B$ becomes the MIDDLE potential ($\frac{1}{2} V_{int}$), and thereby current flow through the current limiter transistor becomes reduced and, in turn, consumption current of the built-in supply voltage dropping circuit is lowered. The remaining description, except for this operation, is the same as the first embodiment, and hence omitted.

In this embodiment, the current flow in the built-in supply voltage dropping circuit can be controlled by activating signals, with similar effects to those of the first embodiment.

The first and second embodiments have been described above using as an example the built-in supply voltage dropping circuit for a sense amplifier. This is not to be construed as limiting the present invention thereto. The present invention can be applied also to for other peripheral circuits. For example, the use of this circuit in a DRAM having auto refreshing function allows electric current to flow in a large quantity during common access and only reduced electric current to flow through the electric current limiter(s) during auto refreshing, thus enabling curtailment of power consumption.

Although the invention has been described with reference to specific embodiments, this description is not meant to be construed in a limiting sense. Various modifications of the disclosed embodiments will become apparent to persons skilled in the art with reference to the description of the invention. It is therefore contemplated that the appended claims will cover any modifications or embodiments as fall within the true scope of the invention.

What is claimed is:

1. A built-in supply voltage dropping circuit comprising:

a current mirror amplifier;

a drive transistor with a gate connected to an output of said current mirror amplifier;

a drain connected to an output terminal; and current limiting means connected in series to said current mirror amplifier and adapted for controlling the current flow through said current mirror amplifier by signal control, wherein said current limiting means consists of a plurality of limiter transistors connected in parallel, and each of at least two different control signals is supplied to the gates of said limiter transistors, respectively.

2. A built-in supply voltage dropping circuit comprising:

a current mirror circuit;

a plurality of current limiter transistors connected in parallel, each of at least two different activating signals being fed to respective gates of said current limiter transistors, respectively, and thereby adapted for controlling the current flow through said current mirror circuit;

first and second transistors provided between said current mirror circuit and said plurality of current limiter transistors and constituting a differential pair; and a drive transistor provided between a power supply and an output terminal and having a gate connected to an output of said current mirror circuit, said output terminal being connected to a gate of said first transistor, and a reference voltage being supplied to a gate of said second transistor.

3. A built-in supply voltage dropping circuit comprising:

a current mirror amplifier;

a drive transistor with a gate connected to an output of said current mirror amplifier;

a drain connect to an output terminal; and current limiting means connected in series to said current mirror amplifier and adapted for controlling the current flow through said current mirror amplifier by signal control, wherein the current flow of said current limiting means reduces itself to a specified flow quantity in a specified time after starting the operation of a succeeding circuit connected to said output terminal, and wherein said signal control is by a plurality of signals, at least one of said signals changing after a specified time lapses.

4. A built-in supply voltage dropping circuit according to claim 3, wherein said succeeding circuit is a sense amplifier drive circuit.

* * * * *

UNITED STATES PATENT AND TRADEMARK OFFICE
CERTIFICATE OF CORRECTION

PATENT NO.   : 5,451,897
DATED        : September 19, 1995
INVENTOR(S)  : Toshio KOMURO It is certified that error(s) appears in the above-identified patent and that said Letters Patent is hereby corrected as shown below:

Col. 3, line 4, delete "$t_6$" and insert --$t_4$--.

Signed and Sealed this

Twenty-seventh Day of August, 1996

Attest:

BRUCE LEHMAN

Attesting Officer        Commissioner of Patents and Trademarks